(12) United States Patent
Wu et al.

(10) Patent No.: US 9,972,621 B1
(45) Date of Patent: May 15, 2018

(54) FIN STRUCTURE IN SUBLITHO DIMENSION FOR HIGH PERFORMANCE CMOS APPLICATION

(71) Applicant: GLOBALFOUNDRIES Inc., Grand Cayman (KY)

(72) Inventors: Xusheng Wu, Ballston Lake, NY (US); Chengwen Pei, Danbury, CT (US); Ziyan Xu, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/483,344

(22) Filed: Apr. 10, 2017

(51) Int. Cl.
| H01L 21/00 | (2006.01) |
| H01L 27/088 | (2006.01) |
| H01L 29/66 | (2006.01) |
| H01L 29/06 | (2006.01) |
| H01L 21/3105 | (2006.01) |
| H01L 21/02 | (2006.01) |
| H01L 29/16 | (2006.01) |
| H01L 29/78 | (2006.01) |
| H01L 21/8234 | (2006.01) |

(52) U.S. Cl.
CPC .... *H01L 27/0886* (2013.01); *H01L 21/02236* (2013.01); *H01L 21/31053* (2013.01); *H01L 21/823431* (2013.01); *H01L 29/0649* (2013.01); *H01L 29/16* (2013.01); *H01L 29/66545* (2013.01); *H01L 29/66795* (2013.01); *H01L 29/7851* (2013.01)

(58) Field of Classification Search
CPC .......... H01L 27/0886; H01L 21/02236; H01L 21/31053; H01L 21/823431; H01L 29/0649; H01L 29/16; H01L 29/66545; H01L 29/7851
See application file for complete search history.

(56) References Cited

U.S. PATENT DOCUMENTS

| 8,674,413 B1 * | 3/2014 | Chi ................. H01L 21/823821 257/213 |
| 9,368,496 B1 | 6/2016 | Yu et al. |

(Continued)

OTHER PUBLICATIONS

Pandey et al., "Methods for Fin Thinning Providing Improved SCE and S/D EPI Growth", U.S. Appl. No. 15/079,142, filed Mar. 24, 2016.

(Continued)

*Primary Examiner* — Nicholas Tobergte
(74) *Attorney, Agent, or Firm* — Ditthavong & Steiner, P.C.

(57) ABSTRACT

A method of forming straight and narrow fins in the channel region and the resulting device are provided. Embodiments include forming Si fins separated by STI regions; recessing the STI regions to reveal the Si fins; forming a nitride layer over the STI regions and the Si fins; forming an OPL over the nitride layer between the Si fins; recessing the OPL to expose portions of the nitride layer over the Si fins; removing exposed portions of the nitride layer; removing the OPL; forming an oxide layer over exposed portions of the Si fins; forming a dummy gate over the nitride layer and the oxide layer perpendicular to the Si fins and surrounded by an ILD; removing the dummy gate and the oxide layer forming a cavity; thinning the Si fins in the cavity; and forming a RMG in the cavity.

19 Claims, 10 Drawing Sheets

(56) References Cited

U.S. PATENT DOCUMENTS

| | | | | |
|---|---|---|---|---|
| 9,379,104 | B1* | 6/2016 | Wu | H01L 21/845 |
| 2008/0001187 | A1* | 1/2008 | Booth | H01L 29/66795 |
| | | | | 257/288 |
| 2014/0027816 | A1* | 1/2014 | Cea | H01L 29/66545 |
| | | | | 257/192 |
| 2015/0028454 | A1* | 1/2015 | Cheng | H01L 29/785 |
| | | | | 257/616 |
| 2016/0379981 | A1* | 12/2016 | Balakrishnan | H01L 27/0924 |
| | | | | 257/192 |
| 2017/0141197 | A1* | 5/2017 | Alptekin | H01L 29/41791 |
| 2017/0250281 | A1* | 8/2017 | Tsai | H01L 29/7848 |

OTHER PUBLICATIONS

Pandey et al., "Finfet Device and Method of Manufacturing", U.S. Appl. No. 15/229,431, filed Aug. 5, 2016.

* cited by examiner

FIN STRUCTURE IN SUBLITHO DIMENSION FOR HIGH PERFORMANCE CMOS APPLICATION

TECHNICAL FIELD

The present disclosure relates to the manufacture of semiconductor devices, such as integrated circuits (ICs). The present disclosure is particularly applicable to fin-type field-effect transistor (FinFET) complementary metal-oxide-semiconductor (CMOS) devices in the 20 nanometer (nm) technology node and beyond.

BACKGROUND

As technologies evolve, semiconductor devices scale to smaller dimensions. The escalating demands for high density and performance associated with semiconductor devices require narrower and straighter fin profiles. However, narrow fins are susceptible to fin bending due to a high height-to-width aspect ratio (i.e., taller height, thinner width). Further, the current fin shaping process results in fins having an undesirably tapered profile, and there is no available solution to create straighter fin profiles having such a narrow width.

A need therefore exists for methodology enabling formation of a straight narrow fin profile and the resulting device.

SUMMARY

An aspect of the present disclosure is a method of forming fins that are narrow and straight in the channel region by reducing the width of the fins in the channel region.

Another aspect of the present disclosure is a device having fins that are narrow and straight in the channel region.

Another aspect of the present disclosure is a method of forming fins that are wider in the source/drain (S/D) region.

Another aspect of the present disclosure is a device having wider fins in the S/D region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming silicon (Si) fins separated by shallow trench isolation (STI) regions and recessing the STI regions to reveal the Si fins. A nitride layer is then formed over the STI regions and the Si fins followed by an organic planarization layer (OPL) being formed over the nitride layer between the Si fins. The OPL is recessed to expose portions of the nitride layer over the Si fins, and exposed portions of the nitride layer are removed. Then the OPL is removed. An oxide layer is formed over exposed portions of the Si fins, and a dummy gate is formed over the nitride layer and the oxide layer, perpendicular to the Si fins and surrounded by an interlayer dielectric (ILD). The dummy gate and the oxide layer are removed, forming a cavity, the Si fins are thinned in the cavity, and then a replacement metal gate (RMG) is formed in the cavity.

Another aspect includes removing the dummy gate and the oxide layer by poly open chemical mechanical planarization (CMP) and poly open processing (POP). Further aspects include thinning the Si fins by oxidizing exposed portions of the Si fins; and removing the oxidized Si. Additional aspects include oxidizing the exposed portions of the Si fins to a width of 0.5 nm to 10 nm. Other aspects include thinning the exposed portions of the Si fins to a width of 4.5 nm to 20 nm.

Another aspect includes recessing the STI regions to a thickness of 50 nm to 500 nm. Further aspects include forming the nitride layer to a thickness of 2 nm to 20 nm. Additional aspects include recessing the OPL to a thickness of 2 nm to 20 nm. Other aspects include removing the nitride layer and the OPL by a dry etch or a wet etch. Further aspects include forming the oxide layer by atomic layer deposition (ALD) to a thickness of 1 nm to 5 nm. Additional aspects include the dummy gate including polysilicon.

A further aspect of the present disclosure is a device including: Si fins in a Si substrate; STI regions over the Si substrate and between the first lower portions of the Si fins; a nitride layer over the STI and adjacent second lower portions of the Si fins above the first lower portions; and a metal gate electrode over and perpendicular to the Si fins, an upper portion of the Si fins being thinner than the first and second lower portions under the metal gate electrode.

Aspects of the device include the upper and second lower portions of the Si fins having a height of 10 nm to 100 nm and a width of 5 nm to 30 nm. Other aspects include the STI regions having a thickness of 50 nm to 500 nm. A further aspect includes the nitride layer having a thickness of 2 nm to 20 nm. Another aspect includes the upper portions of the Si fins having a width of 4.5 nm to 20 nm.

Another aspect of the present disclosure is a method including: forming Si fins separated by STI regions; recessing the STI regions to a thickness of 50 nm to 500 nm to reveal the Si fins with a height of 10 nm to 100 nm and a width of 5 nm to 30 nm; forming a nitride layer to a thickness of 2 nm to 20 nm over the STI regions and the Si fins; forming an OPL over the nitride layer between the Si fins; recessing the OPL to a thickness of 2 nm to 20 nm to expose portions of the nitride layer over the Si fins; removing exposed portions of the nitride layer and the OPL by a dry or a wet etch; forming an oxide layer to a thickness of 1 nm to 5 nm over exposed portions of the Si fins; forming a dummy gate over the nitride layer and the oxide layer perpendicular to the Si fins and surrounded by an ILD; removing the dummy gate and the oxide layer by poly open CMP and POP forming a cavity; thinning the Si fins in the cavity; and forming a RMG in the cavity.

Aspects of the methods include thinning the Si fins by oxidizing exposed portions of the Si fins to a width of 0.5 nm to 10 nm; and removing the oxidized Si. Another aspect includes thinning the exposed portions of the Si fins to a width of 4.5 nm to 20 nm. Other aspects include the gate material layer including polysilicon.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accom- FIGS. 1A through 1J schematically illustrate a process flow for forming a straight and narrow fin profile, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of fin bending attendant upon forming fins with a narrow width in the channel region. In accordance with embodiments of the present disclosure, lower portions of the Si fins are supported from the base by the STI regions and protected by the nitride layer. The lower portions of the Si fins are not thinned down. The upper portions of the Si fins (i.e., fins in the channel region) are thinned to a desired width by an oxidation process. As a result, a straight fin profile with a narrower width in the channel region and wider width under the gate spacer regions and S/D regions are formed.

Methodology in accordance with embodiments of the present disclosure includes forming Si fins separated by STI regions that are recessed to reveal the Si fins. Then, a nitride layer is formed over the STI regions and the Si fins. An OPL is formed over the nitride layer between the Si fins, and the OPL is recessed to expose portions of the nitride layer over the Si fins. Subsequently, exposed portions of the nitride layer and the OPL are removed. Then, an oxide layer is formed over exposed portions of the Si fins. Next, a dummy gate is formed over the nitride layer and the oxide layer, perpendicular to the Si fins and surrounded by ILD. Thereafter, the dummy gate and the oxide layer are removed forming a cavity and thinning the Si fins in the cavity. Finally, an RMG is formed in the cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
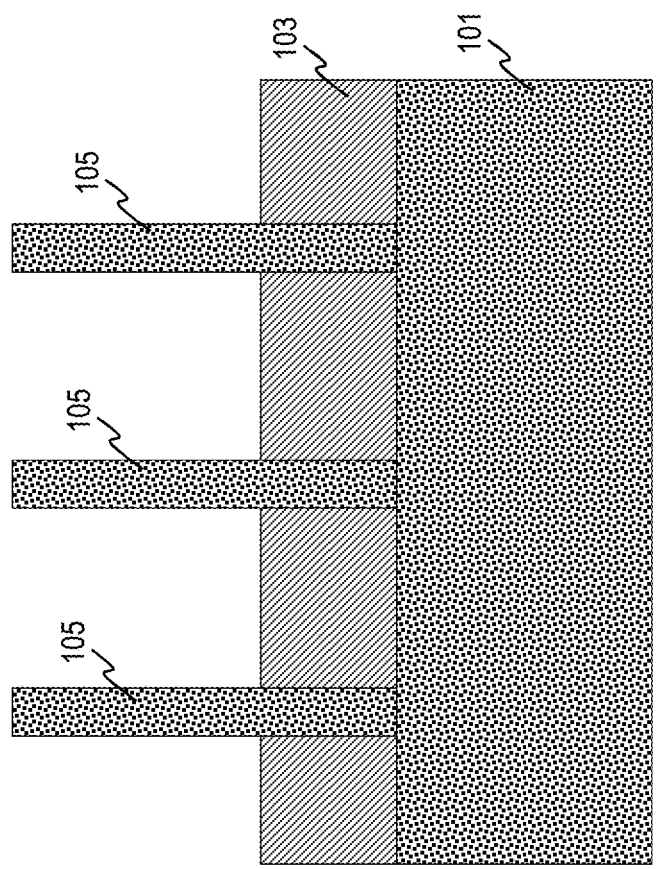
Figure 1B:
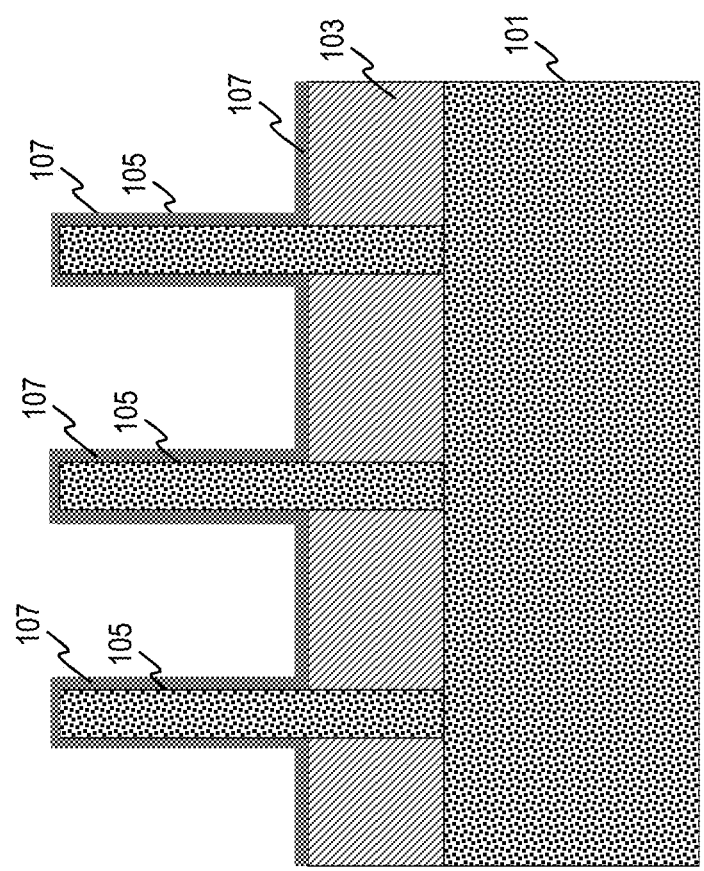
Figure 1C:
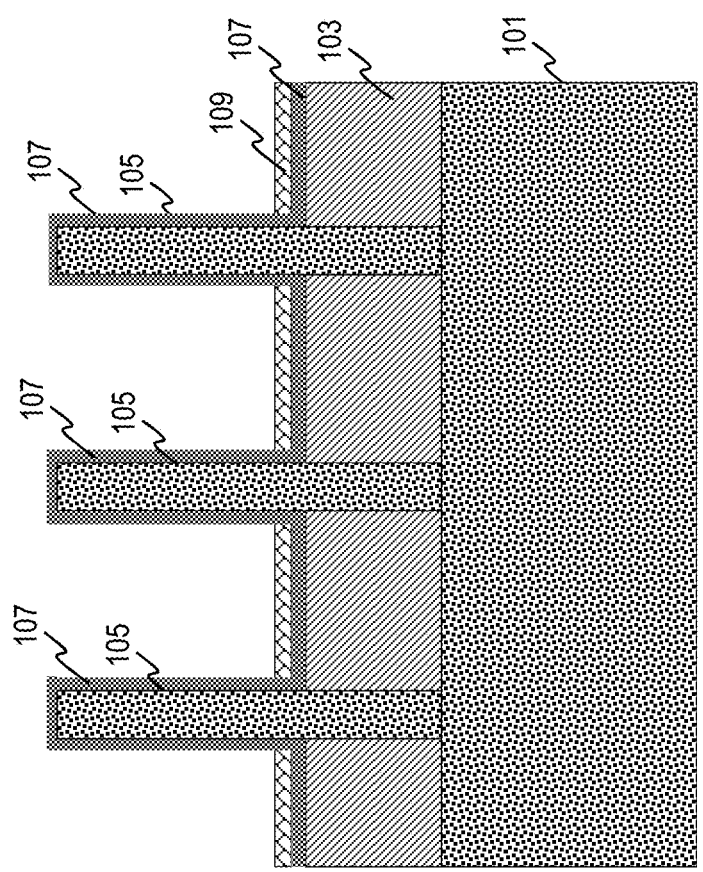

FIGS. 1A through 1J schematically illustrate a process flow for forming a straight and narrow fin profile, in accordance with an exemplary embodiment. The cross-section view of FIGS. 1A through 1J represents Si fins in the channel region. The Si fins under the gate spacer regions and the S/D regions are not shown for illustrative convenience. Adverting to FIG. 1A, STI regions 103 are formed over the Si substrate 101 between the Si fins 105 and then recessed, e.g., to a thickness of 50 nm to 500 nm, thereby revealing the Si fins 105 with a height, e.g., of 10 nm to 100 nm and a width, e.g., of 5 nm to 30 nm. Subsequently, a nitride layer 107 is conformally formed, e.g., to a thickness of 2 nm to 20 nm, by ALD over the STI regions 103 and the Si fins 105, as illustrated in FIG. 1B. The nitride layer 107 may alternatively be formed by chemical vapor deposition (CVD) or plasma enhanced chemical vapor deposition (PECVD). Next, an OPL 109 is formed by spinning over the nitride layer 107 between the Si fins 105. Then, the OPL 109 is recessed, e.g., to a thickness of 2 nm to 20 nm, to expose portions of the nitride layer 107 over the Si fins 105, as illustrated in FIG. 1C.

Figure 1D:
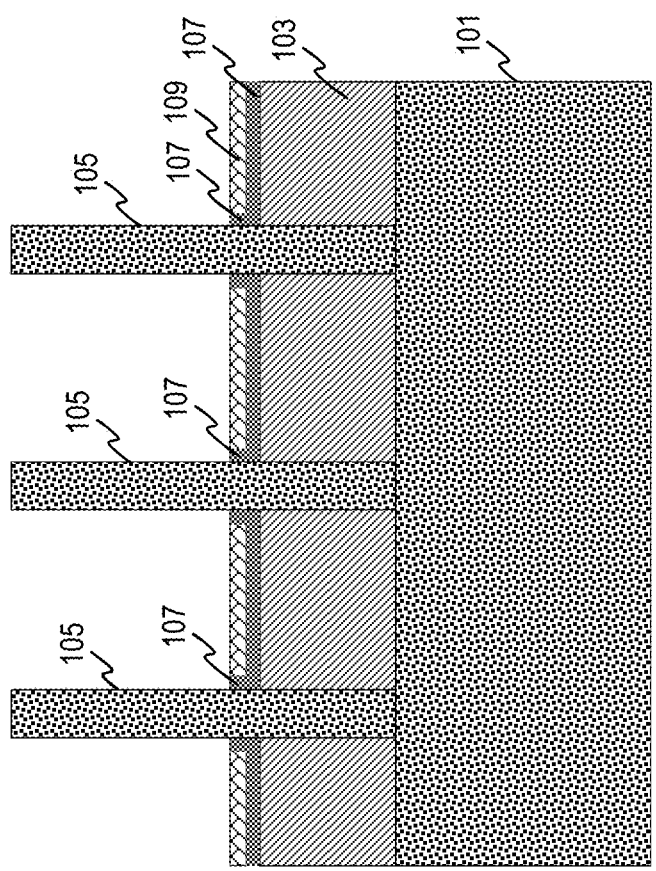
Figure 1E:
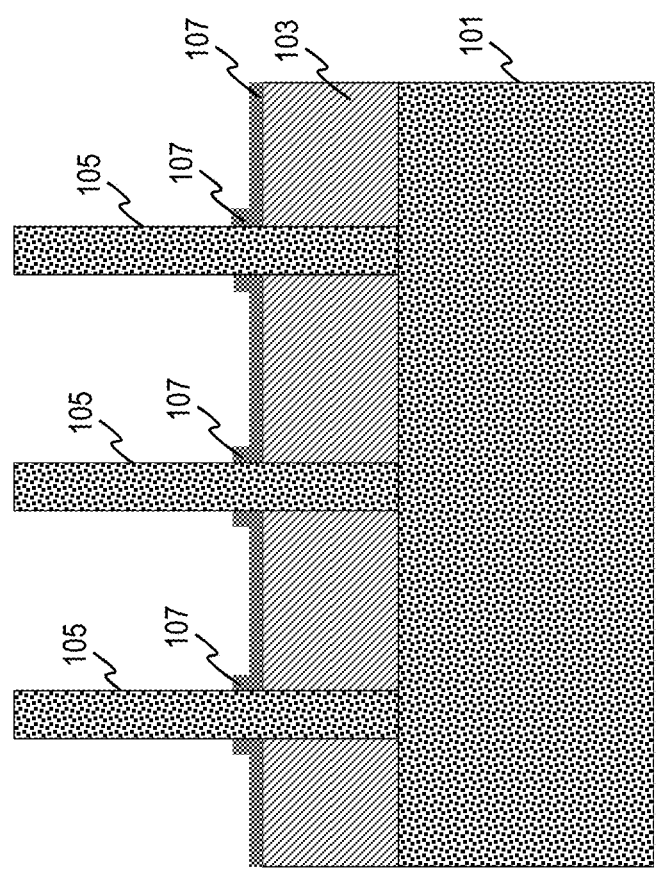
Figure 1F:
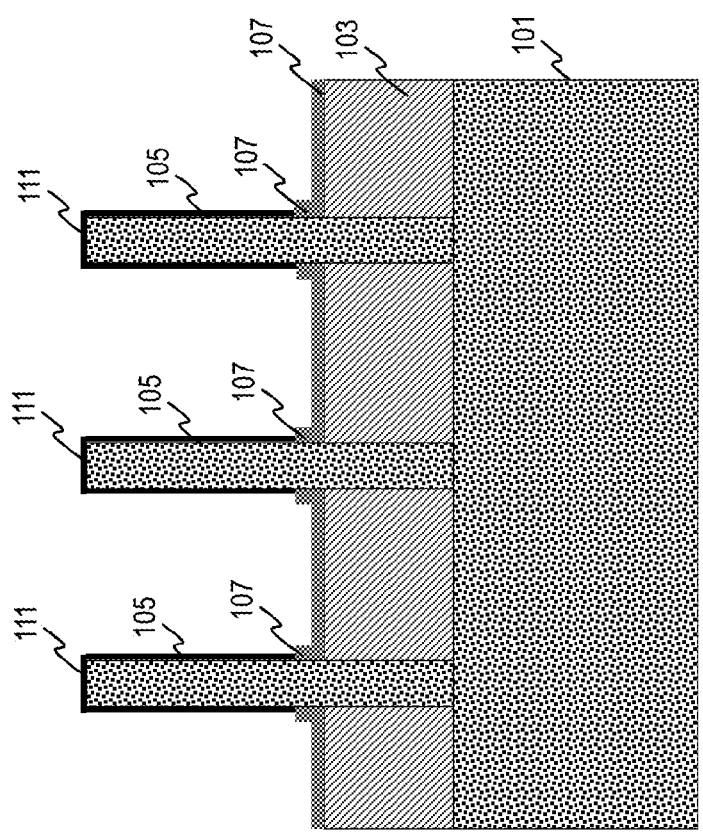
Figure 1G:
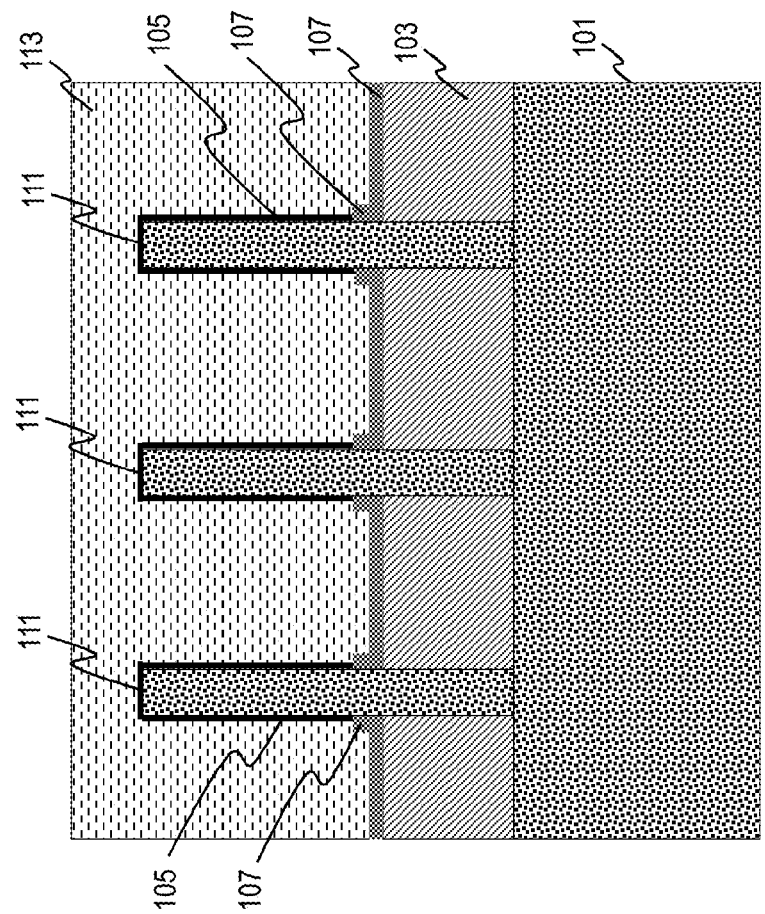
Figure 1H:
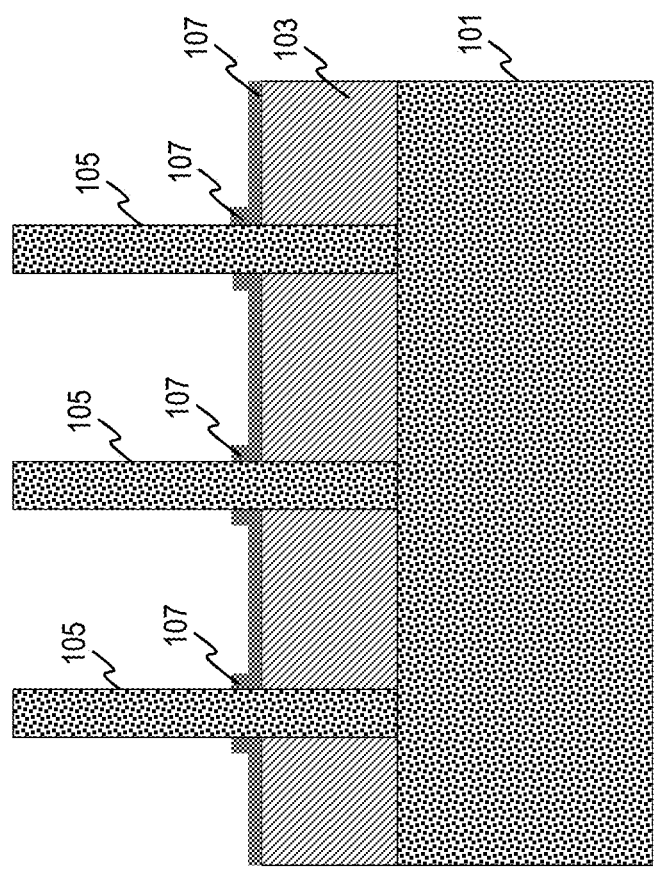

Adverting to FIG. 1D, the exposed portions of the nitride layer 107 are removed, for example, by a dry etch or a wet etch, for example with a gas mixture of $CF_4/O_2/N_2$ or a gas mixture of $NF_3/O_2$ or a hot phosphorus etching. The OPL 109 is then removed, e.g., by a dry etch or a wet etch, as illustrated in FIG. 1E. As shown in FIG. 1F, a gate oxide layer 111 is conformally deposited, e.g., to a thickness of 1 nm to 5 nm, by ALD over the exposed portions of the Si fins 105. The gate oxide layer 111 may alternatively be formed, e.g., by a thermal oxidation process or by CVD or PECVD. Next, a dummy gate 113 is formed, e.g., to a thickness of 30 nm to 150 nm, by CVD or PECVD over the nitride layer 107 and the gate oxide layer 111, perpendicular to the Si fins 105 and surrounded by an ILD (not shown for illustrative convenience), as illustrated in FIG. 1G. The dummy gate 113 is formed, e.g., of polysilicon. Then, a junction module process is implemented to generate S/D regions (not shown for illustrative convenience) for both NFETs and PFETs. After the junction module process, the wafer is covered by the ILD which isolates the S/D regions. Next, a poly open CMP process (not shown for illustrative convenience) is performed to open the channel regions. Then, in FIG. 1H, the dummy gate 113 and the gate oxide layer 111 are removed by poly open CMP and POP, for example with a hydrogen bromide (HBr) based etch or an sulfur hexafluoride ($SF_6$) based etch, forming a cavity in the ILD (not shown for illustrative convenience).

Figure 1I:
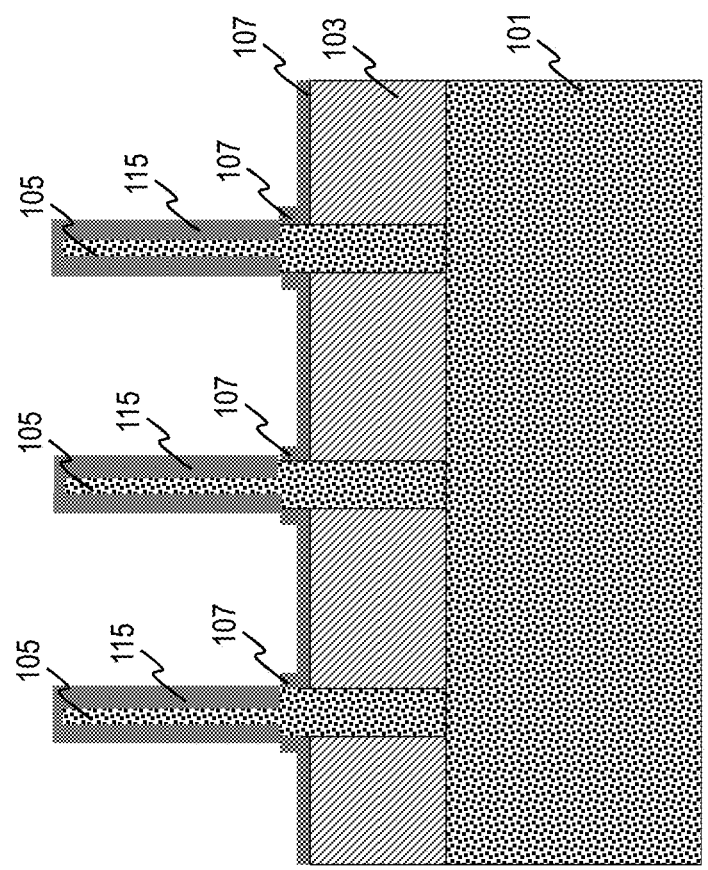
Figure 1J:
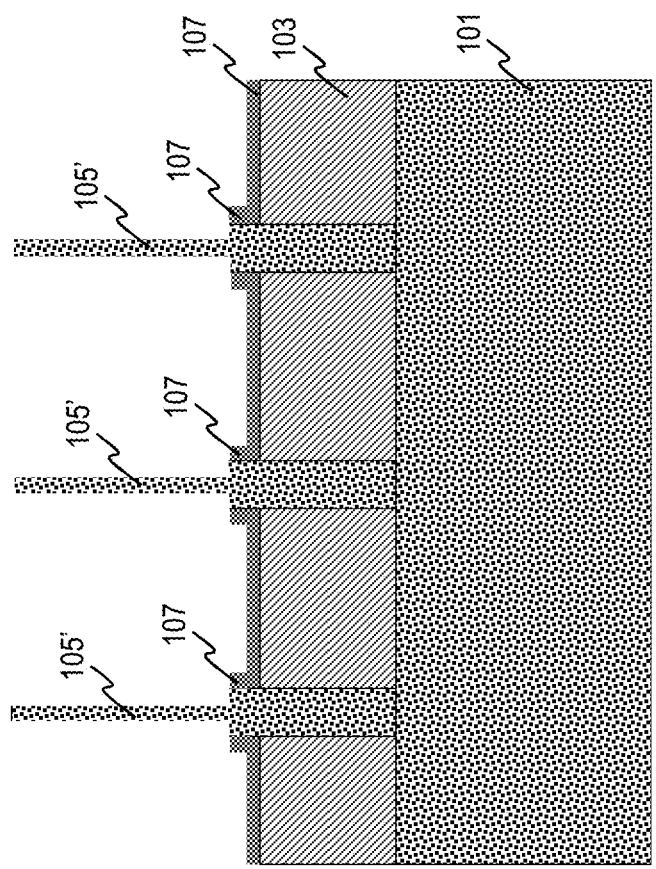

Adverting to FIG. 1I, the Si fins 105 in the cavity are thinned by oxidizing exposed portions of the Si fins 105 (115). The exposed portions 115 are oxidized, e.g., until 0.5 nm to 10 nm of the Si fins 105 remains, forming Si fins 105', as illustrated in FIG. 1J. The lower portion of the Si fins 105' under the gate spacer region and the S/D regions (not shown for illustrative convenience) are protected by the nitride layer 107. The nitride layer 107 prevents the lower portion of the Si fins 105 under the gate spacer region and the S/D regions from being oxidized or thinned. Then, an RMG (not shown for illustrative convenience) is formed over and perpendicular to the Si fins 105' in the cavity (not shown for illustrative convenience). This results in thinner Si fins 105' in the channel region (i.e., under the gate) and wider Si fins 105 in the gate spacer and S/D regions. The width of the Si fins 105' in the channel region are narrowed or thinned, e.g., by 0.5 nm to 10 nm, relative to the Si fins 105 under the gate spacer and S/D regions.

The embodiments of the present disclosure can achieve several technical effects, such as forming narrow fins in the channel region while preventing fin bending. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 20 nm FinFET technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming silicon (Si) fins separated by shallow trench isolation (STI) regions;
   recessing the STI regions to reveal the Si fins;
   forming a nitride layer over the STI regions and the Si fins;
   forming an organic planarization layer (OPL) over the nitride layer between the Si fins;
   recessing the OPL to expose portions of the nitride layer over the Si fins;
   removing exposed portions of the nitride layer;
   removing the OPL;
   forming an oxide layer over exposed portions of the Si fins;
   forming a dummy gate over the nitride layer and the oxide layer perpendicular to the Si fins and surrounded by an interlayer dielectric (ILD);
   removing the dummy gate and the oxide layer forming a cavity;
   thinning the Si fins in the cavity; and
   forming a replacement metal gate (RMG) in the cavity.

2. A method according to claim 1, comprising removing the dummy gate and the oxide layer by poly open chemical mechanical planarization (CMP) and poly open processing (POP).

3. A method according to claim 1, comprising thinning the Si fins by:
   oxidizing exposed portions of the Si fins; and
   removing the oxidized Si.

4. A method according to claim 3, comprising:
   oxidizing the exposed portions of the Si fins to a width of 0.5 nm to 10 nm.

5. A method according to claim 3, comprising:
   thinning the exposed portions of the Si fins to a width of 4.5 nm to 20 nm.

6. A method according to claim 1, comprising recessing the STI regions to a thickness of 50 nanometers (nm) to 500 nm.

7. A method according to claim 1, comprising forming the nitride layer to a thickness of 2 nm to 20 nm.

8. A method according to claim 1, comprising recessing the OPL to a thickness of 2 nm to 20 nm.

9. A method according to claim 1, comprising removing the nitride layer and the OPL by a dry etch or a wet etch.

10. A method according to claim 1, comprising forming the oxide layer by atomic layer deposition (ALD) to a thickness of 1 nm to 5 nm.

11. A method according to claim 1, wherein the dummy gate comprises polysilicon.

12. A device comprising:
    silicon (Si) fins in a Si substrate;
    shallow trench isolation (STI) regions over the Si substrate and between first lower portions of the Si fins;
    a nitride layer over the STI and adjacent second lower portions of the Si fins above the first lower portions; and
    a metal gate electrode over and perpendicular to the Si fins, an upper portion of the Si fins having a width of 4.5 nm to 20 nm and being thinner than the first and second lower portions under the metal gate electrode.

13. A device according to claim 12, wherein the upper and second lower portions of the Si fins have a height of 10 nanometers (nm) to 100 nm and a width of 5 nm to 30 nm.

14. A device according to claim 12, wherein the STI regions have a thickness of 50 nm to 500 nm.

15. A device according to claim 12, wherein the nitride layer has a thickness of 2 nm to 20 nm.

16. A method comprising:
    forming silicon (Si) fins separated by shallow trench isolation (STI) regions;
    recessing the STI regions to a thickness of 50 nanometers (nm) to 500 nm to reveal the Si fins with a height of 10 nanometers (nm) to 100 nm and a width of 5 nm to 30 nm;
    forming a nitride layer to a thickness of 2 nm to 20 nm over the STI regions and the Si fins;
    forming an organic planarization layer (OPL) over the nitride layer between the Si fins;
    recessing the OPL to a thickness of 2 nm to 20 nm to expose portions of the nitride layer over the Si fins;
    removing exposed portions of the nitride layer and the OPL by a dry or a wet etch;
    forming an oxide layer to a thickness of 1 nm to 5 nm over exposed portions of the Si fins;
    forming a dummy gate over the nitride layer and the oxide layer perpendicular to the Si fins and surrounded by an interlayer dielectric (ILD);
    removing the dummy gate and the oxide layer by poly open chemical mechanical planarization (CMP) and poly open processing (POP) forming a cavity;
    thinning the Si fins in the cavity; and
    forming a replacement metal gate (RMG) in the cavity.

17. A method according to claim 16, comprising thinning the Si fins by:
    oxidizing exposed portions of the Si fins to a width of 0.5 nm to 10 nm; and
    removing the oxidized Si.

18. A method according to claim 17, comprising:
    thinning the exposed portions of the Si fins to a width of 4.5 nm to 20 nm.

19. A method according to claim 16, wherein the dummy gate comprises polysilicon.

* * * * *